United States Patent
Koch

(10) Patent No.: US 6,927,718 B2
(45) Date of Patent: Aug. 9, 2005

(54) CIRCUIT ARRANGEMENT AND METHOD FOR REDUCING AN ALIGNMENT ERROR IN A Σ-Δ MODULATOR

(75) Inventor: Rudolf Koch, Oberhaching (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/869,704

(22) Filed: Jun. 16, 2004

(65) Prior Publication Data

US 2005/0007472 A1 Jan. 13, 2005

(30) Foreign Application Priority Data

Jun. 18, 2003 (DE) .......................................... 103 27 621

(51) Int. Cl.[7] .............................................. H03M 3/00
(52) U.S. Cl. ..................................... 341/143; 341/172
(58) Field of Search ............................... 341/143, 172, 341/120, 155, 154

(56) References Cited

U.S. PATENT DOCUMENTS

| | | | | |
|---|---|---|---|---|
| 5,894,284 | A | * 4/1999 | Garrity et al. | 341/172 |
| 6,323,796 | B1 | * 11/2001 | Krone et al. | 341/143 |
| 6,452,531 | B1 | 9/2002 | Miller et al. | |
| 6,489,914 | B1 | * 12/2002 | Jones et al. | 341/120 |
| 6,628,216 | B2 | * 9/2003 | Chen et al. | 341/154 |
| 6,744,392 | B2 | * 6/2004 | Melanson | 341/143 |
| 6,809,672 | B2 | * 10/2004 | Gupta | 341/143 |

2002/0011945 A1   1/2002  Locher

OTHER PUBLICATIONS

"A Tri–Mode Continuous–Time ΣΔ Modulator with Switched–Capacitor Feedback DAC for a GSM–EDGE/CDMA2000/UMTS Receiver", Robert Van Veldhoven, IEEE International Solid–State Circuits Conference, 2003, pp. 60–61, date unknown.

"High–Speed ΣΔ Modulators With Reduced Timing Jitter Sensitivity", Susan Luschas and Hae–Seung Lee, IEEE Transactions on Circuits and Systems–II; Analog and Digital Signal Processing, vol. 49, No. 11, Nov., 2002, pp. 712–719.

* cited by examiner

Primary Examiner—Lam T. Mai
(74) Attorney, Agent, or Firm—Eschweiler & Associates, LLC

(57) ABSTRACT

The invention proposes includes a circuit that operates continuously in the time domain on the basis of the sigma-delta principle. The circuit includes at least one integrating circuit that is characterized by a first transfer function, and has a comparison circuit having a clock signal applied thereto that compares an output signal coming from the at least one integrating circuit with a reference signal and delivers a binary output signal. The circuit further includes an apparatus for signal feedback that is connected to the output of the comparison circuit and to the input of the at least one integrating circuit, and is characterized by a second transfer function. Further, an alignment device is provided that aligns the second transfer function of the apparatus for signal feedback with the first transfer function of the integrating circuit.

24 Claims, 3 Drawing Sheets

CIRCUIT ARRANGEMENT AND METHOD FOR REDUCING AN ALIGNMENT ERROR IN A Σ-Δ MODULATOR

REFERENCE TO RELATED APPLICATIONS

This application claims the benefit of the priority date of German application DE 103 27 621.1, filed on Jun. 18, 2003, the contents of which are herein incorporated by reference in their entirety.

FIELD OF THE INVENTION

The invention relates to a circuit arrangement having a circuit which operates continuously in the time domain on the basis of the Σ-Δ principle.

BACKGROUND OF THE INVENTION

Modern digital technology allows signals to be handled much more easily in digital form than in their analog form. However, it is necessary to convert the received analog signals which are to be handled into their digital form beforehand. Conversely, a digital signal must first be converted into an analog signal before it can be transmitted. For the conversion, "analog/digital converters" or ADCs and the corresponding counterpart DACs for digital/analog converters are used.

So as not to suffer any loss of information when converting an analog signal into a digital signal, the analog signal needs to be sampled, on the basis of the Nyquist criterion, at a frequency which is greater than twice the maximum analog frequency which occurs. At the same time, repetition spectra arise at the multiple of the sampling frequency during sampling. These repetition spectra need to be heavily suppressed as appropriate by a filter.

If the sampling frequency corresponds exactly to the Nyquist criterion, then the sampled spectrum is adjoined by the repetition spectrum directly. Hence, a filter having an almost infinitely high edge gradient is required, which cannot be produced in practice. A sampling rate at a much higher frequency than the Nyquist frequency results in a greater distance between the repetition spectra and allows the use of lower order filters of lesser quality and hence with lower edge gradients.

An analog/digital converter now ascertains the amplitude of the analog signal at a sampling time and converts it into a digital value. In this case, the analog/digital converter divides a maximum amplitude value into subranges of essentially the same magnitude which correspond to the number of bits in the analog/digital converter. By way of example, a maximum occurring voltage amplitude of 1 V is thus divided into 16 stages of 0.125 V each in a 16-bit analog/digital converter.

The analog amplitude signal is compared with the reference values, which assigns an appropriate digital signal. The maximum quantization error is thus half of the difference between two digital reference values, that is to say 62.5 mV in the example. The more precise the division, therefore, the smaller becomes the discrepancy between the result and the analog real value.

One particular embodiment of an analog/digital converter, which is used in digital communication appliances particularly on account of its relatively small demands on the analog suitability of the technology used, is the continuous-time Σ-Δ modulator shown in FIG. 5. This does not convert the analog amplitude signal into a discrete digital value at a sampling time, but rather samples the analog value continuously in the time domain, minimizes the mean-error error over a large number of sampling times, and simultaneously performs filtering (generally high pass filtering) on the quantization errors, which are also called quantization noise.

In this case, the sampling frequency is many times higher than the necessary Nyquist frequency, which means that reference is made to "over sampling" in a general way here. The comparison circuit, the comparator CP in the Σ-Δ modulator shown in FIG. 5, has a signal applied to its input E at one time. This signal is compared with a reference signal at the inverting input of the comparator CP, which means that the comparator outputs a positive or negative binary state at the output.

This signal is firstly processed in a digital decimator and filter DF and is secondly returned to the input of the Σ-Δ modulator via a digital/analog converter DAC. The digital/analog converter DAC converts the digital signal from the comparator into an analog signal using a reference voltage $U_{REF}$ and supplies this analog signal to the input $V_{IN}$ such that the difference between the input signal and the returned signal is formed as a result. This difference signal is integrated and hence averaged in the integrator 3 and is supplied to the input E of the comparison circuit CP again.

The digital decimator DF performs a plurality of tasks. In that part of the Σ-Δ modulator's circuit which is upstream thereof, the quantization noise has not been eliminated, but rather has just been shifted to frequencies outside of the signal band. The first function in the decimator is therefore the filtering of this noise. When this noise has been eliminated, the clock rate can be reduced in the decimator without the risk of infringing the Nyquist theorem. At the same time as the clock rate is reduced, the word length is increased to a number of bits which corresponds at least to the resolution of the converter.

To increase the resolution, the number of integrators 3 can be increased further. This gives the noise transfer function a steeper gradient toward high frequencies, the noise suppression in the signal band being higher on account of the higher gain in the cascaded integrators. Put another way, markedly more effective filtering and hence a lower level of quantization noise in the signal band are achieved.

An example of a "fifth order" Σ-Δ modulator can be seen in FIG. 6. The Σ-Δ modulator contains five integrating circuits, which are denoted by INT1 to INT5. This Σ-Δ modulator is designed using gmC technology and, furthermore, its input $V_{IN}$ has a passive low pass filter which effectively attenuates at least high frequencies and thereby reduces the demands on the active circuit parts downstream.

The drawback of such continuous-time converters, however, is the dependency of the transfer functions and the resolution of time constants, which in ordinary production processes are subject to high levels of scatter of approximately 30%. These are both the usual parameter fluctuations on account of error tolerances in production and temperature responses. Secondly, in usual embodiments with switched current sources in the feedback path, the associated transfer function is dependent on fluctuations in the clock rate itself, known as jitter. In simplified form, jitter corresponds to nonequidistant zero crossings, caused inter alia by thermal noise in the clock generator's components, but also by radiated interference.

Since the integral of the returned signal, generally a current or charge signal, crucially determines the response of the circuit, any clock jitter which is present on the clock signal CLK is incorporated directly into the feedback signal.

If, as is generally the case, the amplitude of the feedback signal is also much higher than the amplitude of the input signal, then the sensitivity toward clock jitter is increased even further.

Hence, the document "IEEE Transactions on Circuits and Systems—II: Analogue and Digital Signal Processing, vol. 49, No 11, November 2002: Highspeed $\Sigma$-$\Delta$-Modulators with Reduced Timing Jitter Sensitivity" has proposed an arrangement which feeds a cosine square signal as the reference signal into the digital/analog converter DAC. This feedback pulse disappears at the sampling times T, which means that a small amount of clock jitter no longer matters. However, producing two symmetrical cosine signals was found to be extremely difficult and costly in practice.

Another proposal is the arrangement which is described in the document "2003 IEEE International Sold State Circuits Conference/Session 3/Oversampled A/D-Converters/Paper 3.4" and is shown in FIG. 6. In this case, the feedback signal used is the charge which is stored on a switched capacitor. In FIG. 6 of the $\Sigma$-$\Delta$ modulator designed using gmC technology, these are the capacitors A. A capacitor is discharged in an exponentially decreasing current, which means that at the end of every clock period the current disappears and hence clock jitter no longer matters. A prerequisite for this is that, for the charging and discharging operation, the capacitor has a time constant which is significantly shorter than the corresponding charging and discharging period. In practice, a time constant which is up to eight times shorter, depending on the resolution of the converter 5, than the corresponding charging and discharging period is generally sufficient.

In the arrangement shown in FIG. 6, the forward transfer function is determined by the integrators. The determining variables are the values of the capacitors at the outputs of the gm blocks and also the gradients (gm values) of these blocks. These gradients in turn are determined by transistor parameters and by the reference currents in these blocks. The reference currents are usually derived from a bandgap voltage reference using a reference resistor. Ultimately, the forward transfer function is thus determined by R, C, a reference voltage and transistor parameters. The reverse transfer function, on the other hand, is determined by the charge transferred. This is dependent on the value of the capacitors A and also on the voltage to which these capacitors are charged. In the embodiment shown in FIG. 6, the clock jitter plays no significant part, which was the aim of this circuit. The reverse transfer function is thus ultimately dependent on C and a reference voltage. However, this means that the absolute production variations in the resistors also result in a divergence (mismatch) between the two transfer functions.

The individual components therefore need to be proportioned such that the noise transfer function remains stable even for the most disadvantageous spread, which results in an increase in the noise and in losses in the signal-to-noise ratio, however. The demands for a high level of stability for the converter and simultaneously low noise with little clock jitter sensitivity cannot be met on the basis of this arrangement.

SUMMARY OF THE INVENTION

It is an object of the present invention to provide a continuous-time $\Sigma$-$\Delta$ modulator with an arrangement and a method which can be used to achieve improved stability for the time constants with simultaneously reduced jitter sensitivity for the converter.

The invention achieves this object by means of the features of the coordinate patent claims.

The invention provides a circuit arrangement having a circuit which operates continuously in the time domain on the basis of the $\Sigma$-$\Delta$ principle and which has at least one comparison circuit, an integrating circuit which has at least one integration element and which is characterized by a transfer function which is dependent on the integration element, and an apparatus for signal feedback.

The apparatus for signal feedback, which is connected to the output of the comparison circuit and to the input of the at least one integrating circuit, has a charge store for the purpose of feedback and is characterized by a transfer function which is dependent on the charge in the charge store. The charge store can be charged during a first period and can be discharged during a second period. The circuit arrangement has an alignment apparatus which can be used to align the two transfer functions.

Aligning the transfer functions, or the charge in the charge store, with the integration element which determines the time constant of the integrating circuit achieves a level of stability for the converter with a simultaneously low noise transfer function regardless of component spreads. The circuit arrangement is also independent of any jitter in the clock signal. It is thus possible to achieve a high level of stability for a circuit operating on the basis of the $\Sigma$-$\Delta$ principle while simultaneously having low quantization noise.

Further advantageous refinements are the subject matter of the subclaims.

It is thus expedient for the transfer function of the apparatus for signal feedback to be aligned with the transfer function of the integrating circuit by the alignment device by altering the charge on the charge store. This charge can easily be achieved by altering the voltage which is used during the charging operation for the charge store.

One particularly advantageous development of the invention is characterized in that the device has a load whose value and form are the same as those of the load which directly or indirectly prescribes the time constant of the integrating circuit's integration element. The device uses this load and uses a current mirror in order to impress a current into an arrangement, the voltage generated across the arrangement by the current controlling a feedback amplification device for charging the charge store in the apparatus for signal feedback.

In this case, it is expedient if the voltage generated across said arrangement is the same as the voltage for charging the charge store. One advantageous refinement of the arrangement is when it is in the form of an external resistor. It is naturally appropriate to produce this with particular precision. As a result, the voltage which is used to charge the capacitor is reciprocally proportional to the load which directly or indirectly prescribes the time constant of the integration element.

Alternatively, the arrangement is in the form of a first and, in parallel therewith, a second charge store having different capacities. The second charge store, which has a smaller capacity than the first charge store, can be connected to the first charge store and to a potential by means of two switches. It is advantageous if the second charge store is connected to the first charge store during the first period and to the potential during the second period.

Hence, a charge flows to the second capacitor in the first period and thus produces a voltage which can be used to control the charging voltage for the feedback capacitor. This charge can drain again during the second period. The first charge store, which is connected to the second charge store by means of a switch during the first charging period, compensates for any clock jitter there may be and hence for the dependency on the clock cycle. In this case, the influence of the clock jitter decreases by the square of the number of averaged cycles. The current mirror likewise means that the voltage generated through the capacitance of the charge store and of the flow of charge is reciprocally proportional to the load which prescribes the time constant of the integration element.

It is expedient for the charge stores to be in the form of capacitors and for the individual switches to be in the form of MOS transistors. It is likewise expedient for the current mirror to be produced using MOS transistors and for the feedback amplification device to be in the form of an operational amplifier. In this connection, it is advantageous if the voltage produced across the arrangement is the same as the voltage for charging the feedback capacitor.

In one development of the invention, the circuit arrangement is characterized by a first switch which can be used to isolate the apparatus for signal feedback from the output of the comparison circuit. In addition, the device has a second switch which can be used to apply a voltage to the input of the circuit arrangement. This voltage is the same as the charging voltage for the charge store in the apparatus for signal feedback.

This makes it possible to ascertain the difference between the charge or the current which flows through the load which prescribes the time constant during a particular period and the charge or the current on the charge store for the feedback. Compensating for this difference aligns the transfer functions with one another and hence reduces a systematic error and the noise.

In this connection, it is advantageous if the alignment device has a counting apparatus with a downstream digital/analog converter. The input of the counting apparatus is connected to the output of the comparison circuit, and the output of the digital/analog converter is connected to the input of the charge store for signal feedback. This allows the charging voltage for the charge store to be varied on the basis of the result of a measurement of the difference.

One alternative embodiment is characterized in that the device has at least one component resistance which can be switched into the signal path upstream of the comparison circuit on the basis of the result from the counting apparatus. This makes it possible to alter the value of the load which directly or indirectly prescribes the time constant of the integration element in the integrating circuit.

One advantageous embodiment of the integrating circuit is the design using RC technology. Alternatively, the integrating circuit is produced using gmC technology.

It is expedient for the voltage of the reference signal for the comparison voltage to be made the same as the voltage for charging the charge store in the apparatus for signal feedback.

A method for reducing an alignment error between a load in an integrating circuit which prescribes the time constant and a charge store for signal feedback, where the charge store is part of a feedback device is provided. The method includes measurement of a difference between the charge which flows through the load which prescribes the time constant during a period and the feedback charge which is supplied via the charge store during this period, and compensation for the difference.

Such difference measurement and the compensation allow accurate alignment of the forward transfer functions, which are dependent on the load which prescribes the time constant, with the reverse transfer function, which is dependent on the charge in the charge store. Besides the charge, it is likewise possible to measure the current which flows through the load and is provided by the charge store.

In one advantageous development of the method, the measurement is taken by applying a voltage having a first polarity to the load which determines the time constant of the integrating circuit. As a result, a defined charge or a defined current flows through the load during a particular period.

A voltage having the same magnitude and having the opposite polarity is used periodically to charge a charge store during a first period and to discharge it during a second period. The sum of these two charges or currents is a measure of the mismatch between the transfer functions of the charge store and of the load.

In one development of the invention, this measurement is taken a plurality of times, with the difference from a measurement being accumulated by the integrating circuit. This allows more precise measurement. The error per measurement is obtained from the quotient of the total error and the number of measurements.

Compensation may advantageously be performed by changing the load which prescribes the time constant. Alternatively, it is conceivable to perform compensation by changing the voltage which is used to charge the capacitor.

Another embodiment is the ascertainment of the number of supplied quantities of charge or current. In this context, a defined and quantized quantity of charge or current is supplied to the charge or current difference until the difference disappears. Advantageously, this quantity of charge or current can be supplied by the charge store in the feedback device.

BRIEF DESCRIPTION OF THE DRAWINGS

The invention is explained in detail below with reference to the drawings, in which.

DETAILED DESCRIPTION OF THE INVENTION

Figure 1:
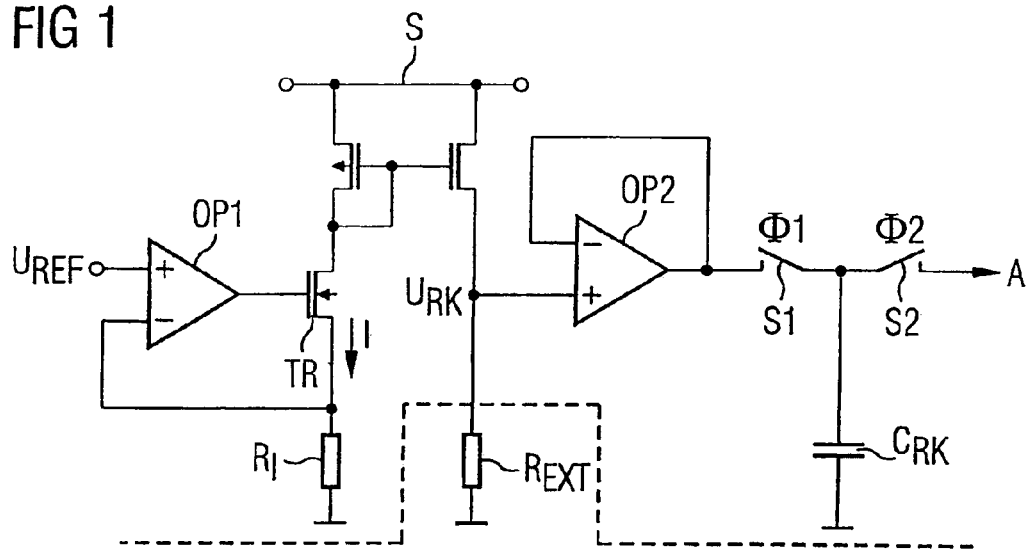
FIG. 1 shows a first exemplary embodiment of the invention.

FIG. 1 shows the device which can be used to align the transfer functions with one another. The inventive device has an operational amplifier OP1 whose output is connected to the gate of a transistor TR. The noninverting input "+" of the operational amplifier is connected to a reference voltage $U_{REF}$. The inverting input "−" of the operational amplifier is connected to the source contact of the transistor TR.

The source contact and the inverting input is also connected to ground via a resistor $R_f$. The resistor $R_f$ is the same, in terms of value and geometry (layout, surroundings, orientation on the IC), as the resistor which determines the time constant in an integrating circuit (not shown in this case).

The drain contact of the transistor TR is connected to a current mirror S, which is formed by two MOS transistors.

In this arrangement, the gate contacts of the two MOS transistors are connected to the drain contact of the transistor TR. The source contact of the second MOS transistor in the current mirror S has a connection to a noninverting input "+" on a second operational amplifier OP2 and to an external resistor $R_{EXT}$, via which it is connected to ground.

The resistor $R_{EXT}$ is not integrated in the circuit, but rather is in the form of an external high-precision-resistor. The output of the operational amplifier OP2 is fed back to the inverting input "−" of the operational amplifier OP2. In addition, the output of the operational amplifier OP2 has two switches S1 and S2. One respective side of the switches S1 and S2 is connected to a feedback capacitor $C_{RK}$. This feedback capacitor stores the charge for the feedback signal.

The operational amplifier OP1 and the resistor $R_I$ are used to derive a reference current I from the reference voltage $U_{REF}$. On account of the resistor $R_I$ being the same as the resistor which determines the time constant in the integrating circuit, the derived reference current I has a defined relationship with the current which is flowing through the load in the Σ-Δ modulator's integrating circuit (not shown here).

A current mirror is used to impress this current onto the external resistor $R_{EXT}$. The voltage drop at the point $U_{RK}$ is thus proportional to $1/R_I$.

While the switch S1 is closed, the feedback capacitor $C_{RK}$ is charged to the voltage $U_{RK}$ via the operational amplifier OP2. The charge stored on the feedback capacitor $C_{RK}$ is thus proportional to $U_{RK}$ and is thus likewise proportional to $1/R_I$.

If the switch S1 is open and the switch S2 is closed, then the feedback capacitor discharges and the stored charge drains. The output A of the device is connected to the input of the integrating circuit in a continuous-time Σ-Δ modulator. The draining charge, which causes a flow of current, is thus added to the input signal for the Σ-Δ modulator.

Figure 4:
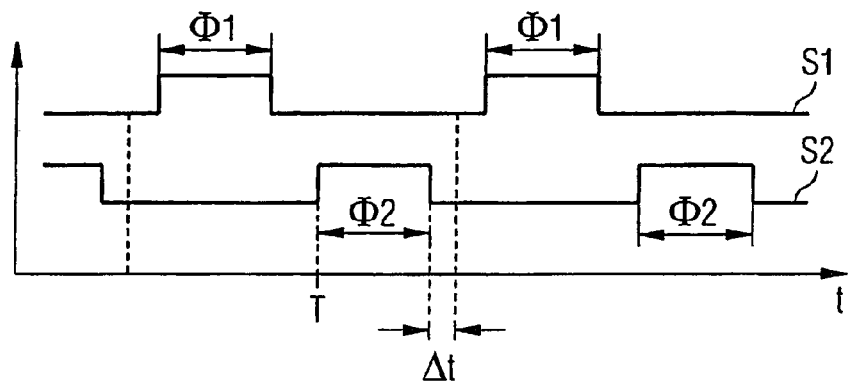
FIG. 4 shows a timing diagram with a clock cycle.
Figure 5:
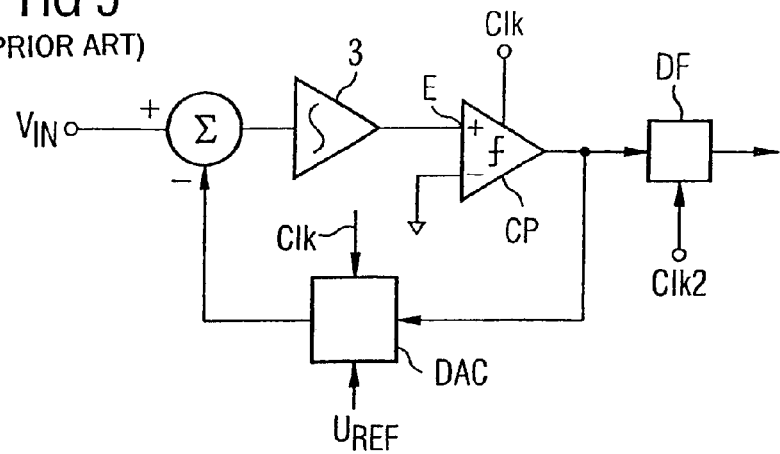
FIG. 5 shows a known embodiment of a continuous-time $\Sigma$-$\Delta$ modulator.

The times and the periods in which the switches S1 and S2 are switched can be seen in FIG. 4. The switch S1 is closed during the period Φ1, and is open at all other times. The same applies to the switch S2, which is closed during the period Φ2. In this case, the period T corresponds to one clock period of the sample signal CLK. In this context, the times Φ1 and Φ2 have been set such that their joint duration is shorter than one time period. In addition, the start or end of Φ1 or Φ2 is slightly shifted by a value ΔT with respect to the clock alternation for the time period T. In this way, any clock jitter which is present does not affect the discharge time or charging time. In addition, the switches, usually MOS transistors, are provided with sufficient time for the switching operation.

The time constant τ for charging or discharging the feedback capacitor $C_{RK}$ is chosen such that it is significantly shorter than the time Φ1 or Φ2. The exponential curve thus results in a tiny charging or discharge current at the end of each period Φ1 and Φ2 and hence also at the end of each clock period. It may thus be assumed that the capacitor is fully charged or discharged. In practice, the time constant is chosen to be typically shorter than ⅐ of the charging time or discharge time Φ1 and Φ2, depending on resolution, which means that the error becomes less than 1 in a thousand.

Figure 2:
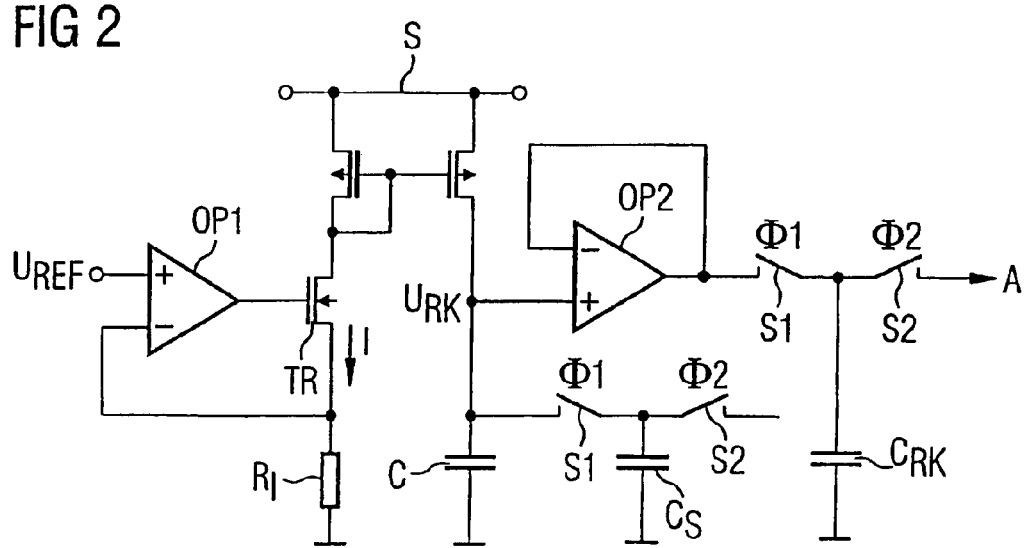
FIG. 2 shows a second exemplary embodiment of the invention.

An alternative embodiment is shown in FIG. 2. In this case, identical components bear the same reference symbols, and their operation is not explained again.

For frequencies<approximately ⅕ of the switching frequency f, a switched capacitor C is equivalent to a resistor R based on R=1/(f*C). Instead of the external resistor $R_{EXT}$, two parallel-connected capacitors C and $C_S$ are used to produce the voltage $U_{RK}$ in this case. $C_S$ replaces the resistor, while C is used only for smoothing the voltage produced and for averaging over the charge reversal operations. The capacitor C is connected to the noninverting input "+" of the operational amplifier OP2, and the capacitor $C_S$ is connected to the same input via a switch S1. In addition, the capacitor $C_S$ is connected to ground via a switch S2. The capacitance of the capacitor $C_S$ is much smaller than the capacitance of the capacitor C. However, in this case too, the time constant of the capacitor $C_S$ is chosen such that it is charged or discharged fully during the period Φ1 or Φ2.

During a first switching period, the switches S1 for charging the capacitors $C_{RK}$ and $C_S$ are closed. Hence, a time-dependent current charges the combination of capacitors C and $C_S$ up to the voltage $U_{RK}$ which is provided by the capacitance. The voltage $U_{RK}$ is used by the operational amplifier OP2 in order to charge the capacitor $C_{RK}$ up to this very voltage. During the second period Φ2, the switch S2 is closed, and the capacitor $C_S$ is discharged through ground. During the same period, the discharge current from the feedback capacitor $C_{RK}$ is supplied to the input signal for the remaining Σ-Δ modulator (not shown here).

The voltage at the noninverting input "+" of the operational amplifier OP2 is also kept at the value $U_{RK}$ by the capacitor C during the period Φ2. Since the capacitance of the capacitor C is larger than the capacitance of the capacitor $C_S$, the capacitor C averages out relatively small fluctuations in charge or current. The fluctuations arise, in particular, on account of the influence of the clock jitter. This averaging therefore reduces the influence of the jitter by the square of the number n of averaged cycles.

Both methods make it possible to change the charge on the feedback capacitor $C_{RK}$ in order to align the transfer function of the feedback system with the transfer function of the load which determines the time constant of the integrating circuit. In this case, the inventive device is part of the feedback device in a circuit which operates on the basis of the Σ-Δ principle. In particular, it may be part of the digital/analog converter DAC, which inverts or does not invert the charge on the feedback capacitor $C_{RK}$, depending on the data signal, and adds it to the input signal.

It is a simple matter to modify the circuit in FIG. 1 or FIG. 2 such that it controls the charging or discharge current for a plurality of feedback capacitors. These feedback capacitors are part of a Σ-Δ circuit which operates on the basis of gmC, OTA-C technology or uses differential signals.

Figure 3:
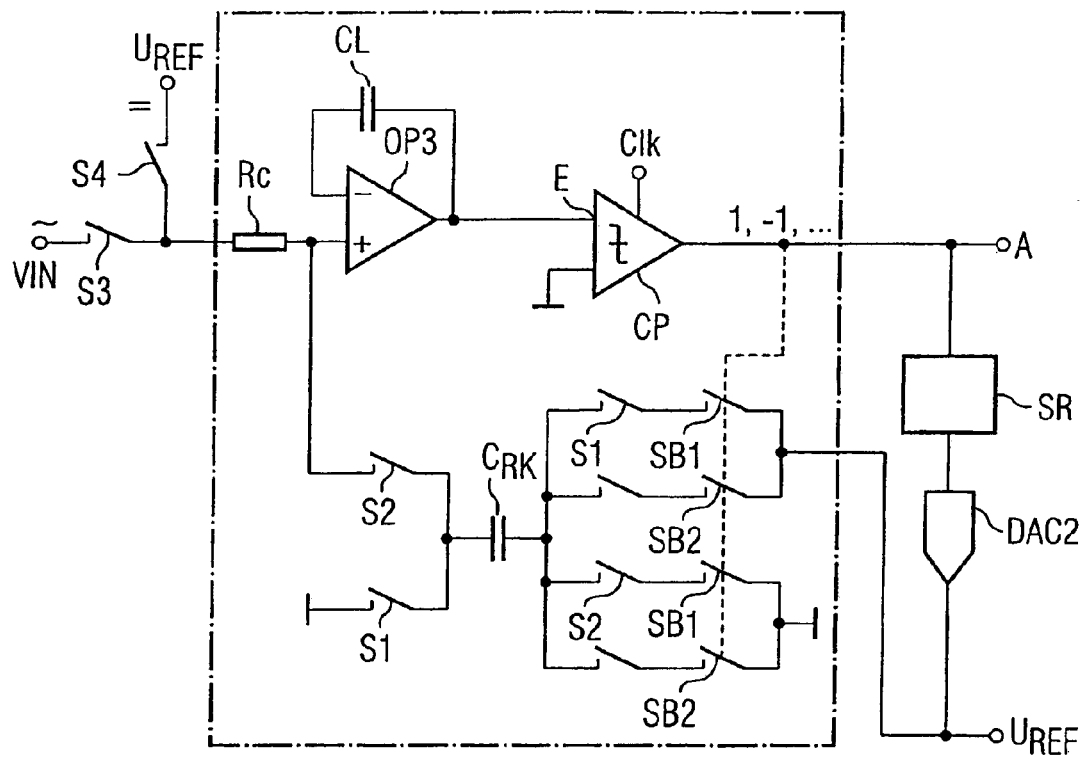
FIG. 3 shows a third exemplary embodiment of the invention.

Another embodiment is shown in FIG. 3. This shows a continuous-time Σ-Δ modulator which has an input $V_{IN}$ and an output A. At the input $V_{IN}$, the Σ-Δ modulator contains a switch S3 which can be used to isolate the analog input signal from the Σ-Δ modulator and, in particular, from the integrating part of the modulator. In addition, the input has a connection to a reference signal $U_{REF}$. This signal can likewise be connected to the input of the Σ-Δ modulator using a switch S4.

The Σ-Δ modulator has an operational amplifier OP3 which forms an integrating circuit together with a capacitor CL and a resistor $R_c$. To this end, the resistor $R_c$ is connected to the noninverting input "+" of the operational amplifier OP3 and to the signal input $V_{IN}$ of the Σ-Δ modulator via the switch S3 or to Uref via the switch S4. The output of the operational amplifier OP3 has a feedback loop to the inverting input "−" of the operational amplifier OP3 via the capacitance CL.

This arrangement forms a known integrator, with the voltage value at the output of the operational amplifier OP3 corresponding to the inverted voltage value at the noninverting input "+". The output voltage from the integrator is compared with a voltage reference value in a comparison circuit CP. The voltage reference value is the ground in this case. The output of the comparison circuit CP is connected to a shift register SR. The output of the shift register SR is routed to a digital/analog converter DAC2 whose output line is connected to a reference signal $U_{REF}$. The reference signal $U_{REF}$ is connected to two switches SB1 and SB2.

The switches SB1 and SB2 are part of a switching matrix comprising the switches SB1, SB2, S1 and S2. The switch S1 is, as indicated in FIG. 4, closed during the period $\Phi1$ and open at all other times. The same applies to the switch S2, which is closed during the period $\Phi2$. The switches SB1 and SB2 can be switched by means of the output signal from the comparison circuit CP. In this case, SB1 is closed whenever one logic state is present, and SB2 is closed when the other logic state is present.

All of the switches S1 and S2 in the switching matrix are routed to the feedback capacitor $C_{RK}$, whose other side is connected via a switch to two further switches S1 and S2. The further switch S1 can be used to connect the feedback capacitor CRK to ground. The further switch S2 can be used to connect the feedback capacitor to the noninverting input "+" of the operational amplifier OP3 during the period $\Phi2$.

In the normal operating situation, the capacitor $C_{RK}$ is charged by the signal $U_{REF}$ in period $\Phi1$ on the basis of the output signal from the comparison circuit CP. In period $\Phi2$, when the switch S2 is closed, the capacitor discharges via the resistor $R_c$. This results in a change in the voltage at the noninverting input "+" of the operational amplifier OP3 and hence in a change in the output voltage.

In the test situation, the switch S3 at the input $V_{IN}$ is opened and the switch S4 for the reference signal is closed. In addition, the switches SB1 and SB2 are isolated from the output of the comparison circuit CP. A reference voltage $U_{REF}$ now drops across the resistor $R_c$ and thus results in a current or in a quantity of charge for a particular period T.

Ideally, the feedback capacitor $C_{RK}$ is charged with precisely the opposite quantity of charge flowing through the resistor $R_c$ during the period T. The two opposite charges compensate for one another in the ideal situation, and the flow of current through $R_c$ and also the voltage at the noninverting input of the operational amplifier OP3 disappear.

If the charges flowing through $R_c$ and via $C_{RK}$ now do not match during the period T, then a current or charge difference becomes established at the input of the operational amplifier OP3. This produces a voltage at the output of the operational amplifier which is a measure of the error in the transfer functions. The arithmetic sign of the voltage indicates which of the two currents or of the two quantities of charge is the greater.

Since this error is a systematic discrepancy, it is accumulated by a fresh measurement. The voltage across the capacitor CL becomes correspondingly higher. After 1000 clock cycles, for example, the switches SB1 and SB2 are connected to the output of the comparison circuit CP again. At the same time, a zero signal is applied to the input of the $\Sigma$-$\Delta$ modulator via the switch S4.

The output of the comparison circuit CP now delivers a logic state which is used to produce a corresponding feedback signal. The feedback signal is opposite to that at the input of the comparison circuit CP.

This is achieved by charging the feedback capacitor $C_{RK}$ with a defined and quantized quantity of charge again which is obtained from the reference voltage $U_{REF}$ and the capacitance of the feedback capacitor. This quantity of charge is supplied to the input of the operational amplifier OP3 in the time period $\Phi2$.

This reduces the charge stored on the capacitor CL in the operational amplifier OP3 as a result of the error, and the voltage at the output falls by the corresponding magnitude. This operation is repeated until the charge difference on the capacitor CL has disappeared. At this point in time, the logic state at the output of the comparison circuit changes.

The number of individual states for the comparison circuit CP before this change is stored in the shift register SR. This is a measure of the magnitude of the error. The arithmetic sign of the output signal from the comparison circuit up to the first change indicates the arithmetic sign of the discrepancy. This method provides a way of accurately determining the mismatch between feedback capacitor $C_{RK}$ and integration resistor $R_c$ up to half a capacitor charge. The minimum error is thus just half an LSB.

Once the mismatch between the resistor $R_c$ and the capacitor $C_{RK}$ has been determined in this manner, an adjustment can be made. This is done by counting the number of identical logic states in the shift register SR. A DAC converter DAC2 is then used to add an appropriate signal to the reference voltage $U_{REF}$ so as to align the transfer function of the capacitor $C_{RK}$ with the transfer function of the resistor $R_c$.

If, by way of example, an accumulated error voltage across CL over 1000 clock cycles results in a mismatch for 250 capacitor charges in the feedback capacitor, then the digital/analog converter DAC2 needs to be used to increase or reduce the reference voltage $U_{REF}$ by one quarter, depending on the arithmetic sign of the output signal from the comparison circuit CP.

Another means of alignment may be for the resistance $R_c$ to be altered by adding or omitting individual component resistances. These may be connected in parallel or in series. This alters the time constant of the integrating circuit.

Yet another option is to change the capacitance of the feedback capacitor by adding or omitting individual component capacitances. It is naturally also possible to find combinations of these options.

This method provides a simple way of achieving alignment, which firstly reduces the quantization noise and increases the stability of the converter. Since it is not possible to evaluate an input signal during measurement of the difference between feedback capacitor and the load which determines the time constant, the measurement needs to be taken during a powerup sequence and/or during burst pauses. Hence, periodic performance and readjustment are also possible, however, for example in order to be able to react to temperature fluctuations.

A core concept of the invention is thus circuits and a method which aligns the transfer function of a feedback capacitor in a feedback device with the transfer function of the load which determines the time constant. Such a circuit is preferably used in continuous-time $\Sigma$-$\Delta$ modulators. In this case, the exemplary embodiments discussed here can be combined with one another in any way, as can the measurement method described.

Figure 6:
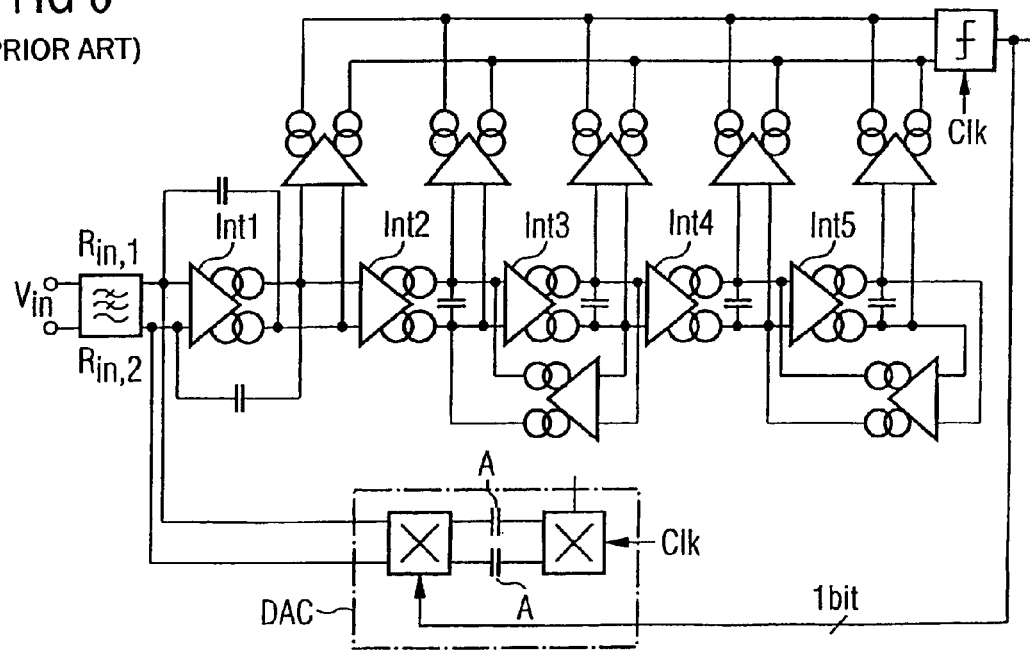
FIG. 6 shows a known embodiment of a fifth order continuous-time $\Sigma$-$\Delta$ modulator.

It is not limited thereto, however, but rather may also be applied to any conceivable architecture for $\Sigma$-$\Delta$ converters, that is to say particularly to any low pass or band pass converter, to real and complex converters, single-loop or cascading converters. Next to this is use in single-ended or in differential embodiments of the stated converters. The inventive circuit can thus easily be implemented in a fifth order $\Sigma$-$\Delta$ modulator in the differential embodiment in FIG. 6.

What is claimed is:

1. A circuit arrangement having a circuit which operates continuously in the time domain on the basis of the Σ-Δ principle, comprising:
   at least one integrating circuit comprising an integration element and a first transfer function associated therewith that is dependent on the integration element;
   at least one comparison circuit having a clock signal applied thereto, configured to compare an output signal coming from the at least one integrating circuit with a reference signal and deliver a digital output signal that comprises at least one bit in response to the comparison;
   an apparatus for signal feedback connected to the output of the comparison circuit and to the input of the at least one integrating circuit, wherein the apparatus is configured to use a charge stored on a charge store for the purpose of feedback, the charge store being charged during a first period and being discharged during a second period, the apparatus for signal feedback having a second transfer function associated therewith that is dependent on the charge on the charge store; and
   an alignment device configured to align the second transfer function of the apparatus for signal feedback with the first transfer function of the integrating circuit.

2. The circuit arrangement as claimed in claim 1, wherein the second transfer function of the apparatus for signal feedback is aligned with the first transfer function of the integrating circuit by the alignment device by altering the charge on the charge store.

3. The circuit arrangement as claimed in claim 1, wherein the at least one integrating circuit is designed using RC technology.

4. The circuit arrangement as claimed in claim 1, wherein the at least one integrating circuit is designed using LC, gmC or OTA-C technology.

5. The circuit arrangement as claimed in claim 1, wherein the voltage of the reference signal for the comparison circuit is the same as the voltage for charging the charge store in the apparatus for signal feedback.

6. The circuit arrangement as claimed in claim 1, wherein the alignment device comprises a load whose value and form are the same as those of a load that directly or indirectly prescribes a time constant of the integration element, wherein the alignment device uses the load and a current mirror in order to impress a current into an arrangement, and a voltage generated across the arrangement by the current to control a feedback amplification device for charging the charge store in the apparatus for signal feedback.

7. The circuit arrangement as claimed in claim 6, wherein the voltage generated across the arrangement is the same as the voltage for charging the charge store.

8. The circuit arrangement as claimed in claim 6, wherein the arrangement comprises a nonintegrated resistor.

9. The circuit arrangement as claimed in claim 6, wherein the arrangement comprises a first charge store and, in parallel therewith, a second charge store having different capacities, the second charge store of smaller capacity and operable to connect to the first charge store through a first switch and to a potential through a second switch.

10. The circuit arrangement as claimed in claim 9, wherein the second charge store is connected to the first charge store during the first period and to the potential during the second period.

11. The circuit arrangement as claimed in claim 9, wherein the first and second charge stores comprise capacitors.

12. The circuit arrangement as claimed in claim 6, wherein the current mirror comprises MOS transistors.

13. The circuit arrangement as claimed in claim 6, wherein the feedback amplification device comprises an operational amplifier with feedback.

14. The circuit arrangement as claimed in claim 1, further comprising:
   a first switch configured to selectively isolate the apparatus for signal feedback from the output of the comparison circuit; and
   a second switch configured to selectively apply a voltage to the input of the circuit arrangement that is the same as the charging voltage for the charge store in the apparatus for signal feedback.

15. The circuit arrangement as claimed in claim 14, wherein the alignment device comprises a counting apparatus coupled to a downstream digital/analog converter.

16. The circuit arrangement as claimed in claim 15, wherein the input of the counting apparatus is connected to the output of the comparison circuit, and the output of the digital/analog converter is connected to the input of the charge store for signal feedback.

17. The circuit arrangement as claimed in claim 15, wherein the alignment device further comprises at least one component load that, depending on a result from the counting apparatus, is connected to a load that determines a time constant of the at least one integrating element.

18. A method for reducing an alignment error between a load that prescribes a time constant in an integrating circuit and a charge store for signal feedback in a circuit which operates on the basis of the sigma-delta principle, where the charge store is part of a feedback device, comprising:
   measuring a difference between the charge that flows through the load that prescribes the time constant during a time period and a feedback charge that is supplied via the charge store during the time period; and
   compensating for the measured difference.

19. The method as claimed in claim 18, wherein measuring the difference comprises taking a difference measurement for the current that flows through the load and the charge store, or taking a difference measurement for the voltage across the load and the charge store.

20. The method as claimed in claim 18, wherein measuring the difference comprises applying a voltage having a first polarity to the load that determines the time constant and a voltage having the same magnitude and having the opposite polarity to the charge store for signal feedback, the charge store being periodically charged during a first period and discharged during a second period.

21. The method as claimed in claim 19, wherein measuring the difference is performed a plurality of times, with the resultant difference from the measurements being accumulated by the integrating circuit.

22. The method as claimed in claim 19, wherein compensating comprises changing the load that prescribes the time constant.

23. The method as claimed in claim 19, wherein compensating comprises changing a voltage that is used to charge the charge store in the feedback device.

24. The method as claimed in claim 18, wherein compensating comprises supplying a defined and quantized quantity of charge to the charge difference until the charge difference disappears and a number of quantities of charge supplied is ascertained in the process.

* * * * *